(12) United States Patent
Friedrich et al.

(10) Patent No.: US 8,975,532 B2
(45) Date of Patent: Mar. 10, 2015

(54) LIGHT-EMITTING DIODE ARRANGEMENT FOR A HIGH-POWER LIGHT-EMITTING DIODE AND METHOD FOR PRODUCING A LIGHT-EMITTING DIODE ARRANGEMENT

(75) Inventors: Marco Friedrich, Regensburg (DE); Robert Kraus, Regensburg (DE)

(73) Assignee: OSPAM Opto Semiconductor GmbH, Regensburg (DE)

( * ) Notice: Subject to any disclaimer, the term of this patent is extended or adjusted under 35 U.S.C. 154(b) by 1742 days.

(21) Appl. No.: 10/590,744

(22) PCT Filed: Feb. 2, 2005

(86) PCT No.: PCT/DE2005/000170
§ 371 (c)(1),
(2), (4) Date: May 17, 2007

(87) PCT Pub. No.: WO2005/083803
PCT Pub. Date: Sep. 9, 2005

(65) Prior Publication Data
US 2007/0291503 A1  Dec. 20, 2007

(30) Foreign Application Priority Data
Feb. 26, 2004  (DE) .......................... 10 2004 009 284

(51) Int. Cl.
*H01K 1/16* (2006.01)
*H01L 33/62* (2010.01)
*H01L 25/075* (2006.01)
(Continued)

(52) U.S. Cl.
CPC ............ *H01L 33/62* (2013.01); *H01L 25/0753* (2013.01); *H01L 33/642* (2013.01); *H05K 1/0209* (2013.01); *H01L 2224/48091* (2013.01); *H01L 2224/48247* (2013.01); *H05K 1/189* (2013.01); *H05K 2201/09781* (2013.01); *H05K 2201/10106* (2013.01); *H01L 2924/12041* (2013.01)
USPC ....................... 174/260; 174/252; 362/249.02

(58) Field of Classification Search
CPC ... H01L 25/0753; H01L 33/62; H01L 33/642; H01L 2224/48091; H01L 2224/48247; H01L 2924/12041; H01L 2924/00014; H05K 1/0209; H05K 1/189; H05K 2201/09781; H05K 2201/10106
USPC .................................. 174/252, 254, 261, 262
See application file for complete search history.

(56) References Cited

U.S. PATENT DOCUMENTS 6,498,355 B1 * 12/2002 Harrah et al. ................... 257/99
6,520,669 B1    2/2003 Chen et al.
(Continued)

FOREIGN PATENT DOCUMENTS

DE   199 22 176 A1   11/2000
DE   199 26 746 A1   12/2000
(Continued)

OTHER PUBLICATIONS

Osram Opto Semiconductors Data Sheet: "Golden Dragon 1Watt LED", LA W57B, LY W57B, May 8, 2003.

*Primary Examiner* — Ishwarbhai B Patel
(74) *Attorney, Agent, or Firm* — Cozen O'Connor

(57) ABSTRACT

A light emitting diode arrangement, having at least one high power light emitting diode, the high power light emitting diode being mounted onto a flexible circuit board. A method is also disclosed for producing such a light emitting diode arrangement.

34 Claims, 2 Drawing Sheets

(51) Int. Cl.
*H01L 33/64* (2010.01)
*H05K 1/02* (2006.01)
*H05K 1/18* (2006.01)

(56) References Cited

U.S. PATENT DOCUMENTS

| | | | |
|---|---|---|---|
| 6,857,767 B2 * | 2/2005 | Matsui et al. | 362/373 |
| 6,860,620 B2 * | 3/2005 | Kuan et al. | 362/294 |
| 7,273,987 B2 * | 9/2007 | Becker et al. | 174/260 |
| 2002/0001193 A1 | 1/2002 | Osawa et al. | |
| 2003/0178627 A1 * | 9/2003 | Marchl et al. | 257/80 |
| 2004/0037080 A1 * | 2/2004 | Luk et al. | 362/252 |
| 2004/0075100 A1 | 4/2004 | Bogner et al. | |

FOREIGN PATENT DOCUMENTS

| | | |
|---|---|---|
| DE | 201 20 770 U1 | 3/2002 |
| DE | 10117889 | 10/2002 |
| DE | 101 34 381 A1 | 1/2003 |
| EP | 0535491 | 4/1993 |

* cited by examiner

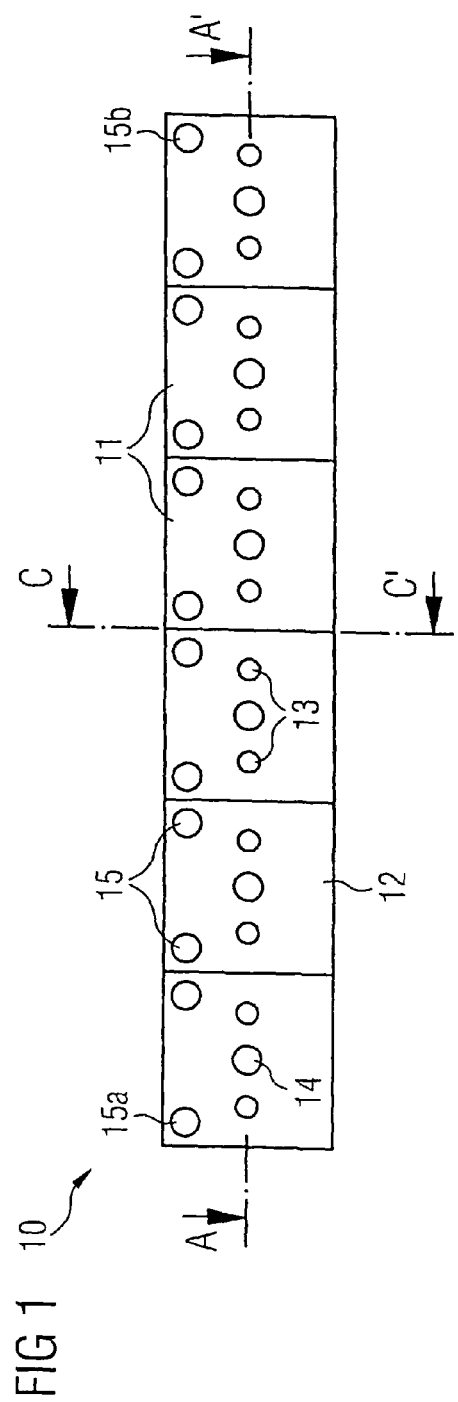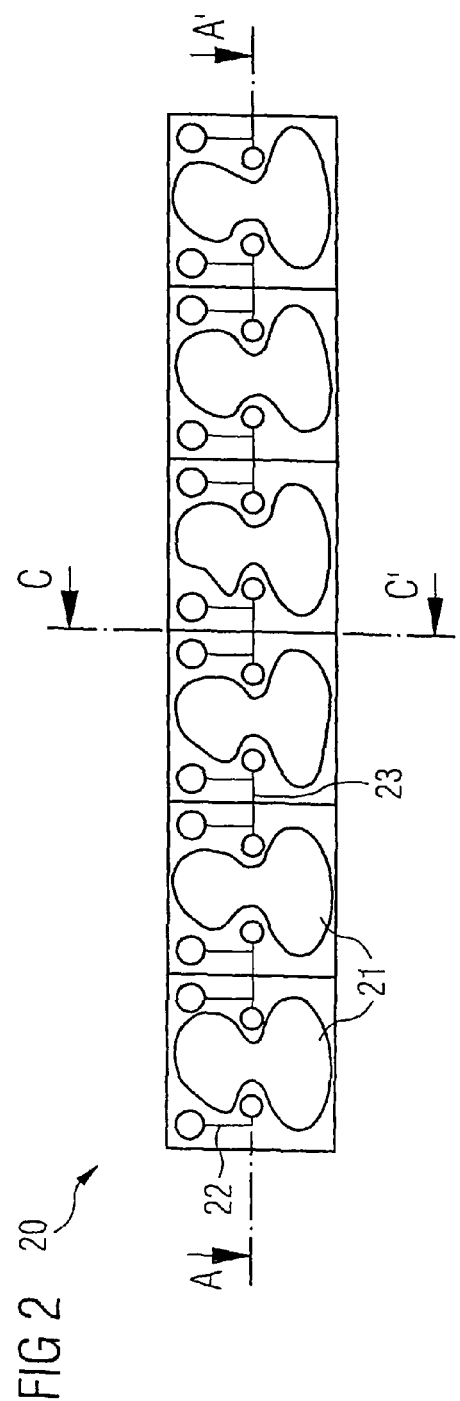

LIGHT-EMITTING DIODE ARRANGEMENT FOR A HIGH-POWER LIGHT-EMITTING DIODE AND METHOD FOR PRODUCING A LIGHT-EMITTING DIODE ARRANGEMENT

RELATED APPLICATIONS

This is a U.S. national stage of application No. PCT/DE2005/000170, filed on Feb. 2, 2005.

This patent application claims the priority of German patent application no. 10, 2004, 009, 284.2-33 filed Feb. 26, 2004, the disclosure content of which is hereby incorporated by reference.

FIELD OF THE INVENTION

The invention relates to a light emitting diode arrangement for high power light emitting diodes which are mounted onto a flexible circuit board. Furthermore, the invention relates to a method for producing the light emitting diode arrangement.

BACKGROUND OF THE INVENTION

U.S. Pat. No. 6,848,819 B1 describes a light emitting diode array which is surface-mounted on a flexible board and which is applied on a heat sink. In this case, the heat sink may have any desired form, so that motor vehicle lamps such as flashing indicators or the like can be constructed which can be adapted to the external contour of the vehicle.

SUMMARY OF THE INVENTION

It is an object of the present invention to provide a light emitting diode arrangement for high power light emitting diodes which is particularly easy to mount. Furthermore, it is an object of the invention to provide a method for producing such a light emitting diode arrangement.

These and other objects are attained in accordance with one aspect of the present invention directed to a light emitting diode arrangement, comprising a flexible circuit board and at least one high power light emitting diode mounted onto the flexible circuit board.

A light emitting diode arrangement having at least one high power light emitting diode is specified. In this case, the high power light emitting diode is mounted onto a flexible circuit board. In this connection, high power light emitting diodes are understood to mean light emitting diodes which have a power consumption of at least 300 mW. The typical power consumption for a high power light emitting diode lies between 1 and 3 W. One example of such a high power light emitting diode is, for example, the light emitting diode known from published U.S. patent application No. 2004/0075100A1.

On account of their relatively high power consumption, high power light emitting diodes exhibit a thermal emission. The light emitting diode known from published U.S. patent application No. 2004/0075100A1 has a thermal connection part which bears on a mounting carrier and by means of which the heat arising during operation of the LED is emitted to the mounting carrier.

In the present light emitting diode arrangement, the mounting carrier is provided by a flexible circuit board. In one preferred embodiment of the light emitting diode arrangement, the high power light emitting diode is soldered onto the flexible circuit board. By means of the soldering process the light emitting diode is both electrically contact-connected to the flexible circuit board and mechanically fixed on the circuit board.

In one preferred embodiment, the flexible circuit board contains at least one flexible carrier layer. In this case, the flexible carrier layer preferably contains one of the following materials: polyimide, polyethylene naphthalate, polyester, FR4. Other materials may also be suitable for use in the flexible carrier layer of the circuit board if, in this case, the flexibility of the circuit board is preserved and good transmission of the heat generated by the high power light emitting diode is ensured by the carrier layer.

The flexible circuit board furthermore preferably contains a thermally conductive layer. This thermally conductive layer is in thermal contact with the high power light emitting diode. Said thermal contact may be produced for example by soldering the thermal connection part of the high power light emitting diode onto the thermally conductive layer. From the thermal connection part of the high power light emitting diode, heat propagates firstly in the thermally conductive layer. Afterward, the heat is emitted to the surroundings over a large area and taken up for example by the flexible carrier layer. For its part, the flexible carrier layer dissipates the heat to the surroundings over a large area.

Owing to the good heat conducting properties of metal, a metal is preferably used for the thermally conductive layer. In one particular preferred embodiment of the light emitting diode arrangement, the thermally conductive layer contains copper.

In one embodiment of the light emitting diode arrangement, the thermally conductive layer and also the electrical conductor tracks are situated in the same plane of the flexible circuit board. The thermally conductive layer is preferably a separate layer. That is to say that the thermally conductive layer and electrical conductor tracks are situated in a common plane of the flexible circuit board, but are not connected to one another. In particular, the thermally conductive layer is not in electrical contact with the conductor tracks. By way of example, the thermally conductive layer is in thermal contact with a thermal connection part of the light emitting diode as described above.

In one preferred embodiment of the light emitting diode arrangement, the thermally conductive layer and also the electrical conductor tracks contain the same metal. Owing to its good thermal and electrical conductivity, copper, for example, is equally well suited to use in the thermally conductive layer and the electrical conductor tracks.

In one embodiment of the light emitting diode arrangement, one of the surfaces of the flexible circuit board is covered with an electrically insulating layer. The insulating layer preferably contains soldering resist. In one particularly preferred embodiment, the insulating layer has cutouts for making thermal and electrical contact with the high power light emitting diode. Through said cutouts, the high power light emitting diode may for example be thermally connected to the thermally conductive layer and electrically connected to the conductor tracks.

In one particularly preferred embodiment of the light emitting diode arrangement, an adhesive-containing layer is applied to that side of the flexible circuit board which is remote from the high power light emitting diodes. In this case, said adhesive-containing layer is preferably formed by a double sided adhesive tape which is adhesively bonded by one of its adhesive surfaces onto the flexible circuit board in such a way that it completely covers the circuit board and terminates flush with the latter at the edges.

In order to prevent inadvertent adhesive bonding on the circuit board, the adhesive tape fixed on the circuit board is preferably sealed with a protective film at its free surface. Before the light emitting diode arrangement is applied at its intended location, said protective film merely has to be pulled off. In other words the light emitting diode arrangement can be adhesively bonded onto its intended location in terms of a decal picture.

In one particular preferred embodiment of the light emitting diode arrangement, the protective film in this case contains a plastic.

A particularly heat-resistant adhesive-containing layer is preferably used for the light emitting diode arrangement. In this case, the adhesive-containing layer can momentarily withstand temperatures of up to 250° C. without being damaged. When the adhesive-containing layer is momentarily heated to this temperature value, the adhesive-containing layer does not lose its adhesive effect. A fixed adhesion of the light emitting diode arrangement at its intended location thus remains ensured even when the adhesive-containing layer is heated.

A particularly thin adhesive-containing layer having a maximum thickness of 60 μm is particularly preferred in this case. As a result, on the one hand it is ensured that the light emitting diode arrangement is very thin overall, and on the other hand the heat emitted to the flexible circuit board from the high power light emitting diode is conducted particularly well through such a thin layer and can then be emitted from there to the surroundings, for example the area onto which the light emitting diode arrangement is adhesively bonded.

In one particularly preferred embodiment of the light emitting diode arrangement, a multiplicity of high power light emitting diodes are applied on the flexible circuit board. In this case, the high power light emitting diodes are preferably connected in series.

A pair of contact areas via which electrical contact can be made with the high power light emitting diode is preferably predetermined for each high power light emitting diode.

The light emitting diode arrangement is preferably subdivided into sections, each section having a high power light emitting diode and the associated pair of contact areas. Said sections are advantageously arranged on the printed circuit board as repeating, regular structures.

In one particularly preferred embodiment of the light emitting diode arrangement, said sections are arranged in a series. The arrangement described makes it possible to make contact with the totality of the high power light emitting diodes on the flexible circuit board by connecting the two outermost contact areas—at opposite sides of the light emitting diode arrangement—on the circuit board to a current source.

Furthermore, the described construction of the light emitting diode arrangement enables the light emitting diode arrangement to be divided particularly simply between the sections, thereby giving rise to partial light emitting diode arrangements each having a smaller number of sections than the original light emitting diode arrangement. It is also possible in the case of these light emitting diode arrangements having a smaller number of high power light emitting diodes to make contact with in each case the totality of the light emitting diodes on the arrangement in the manner described. In this case, the light emitting diode arrangement can be divided to an extent such that individual sections having in each case one high power light emitting diode and a pair of contact areas arise. In this way, the size of the light emitting diode arrangement and the number of light emitting diodes can be adapted to their intended purpose and the conditions of the intended location. That is to say that the light emitting diode arrangement is adapted for example to the required luminosity or the existing space.

An illumination device is furthermore specified, in which the light emitting diode arrangement is applied to a predefined heat sink. In this case, the light emitting diode arrangement is preferably adhesively bonded onto the heat sink by its adhesive-containing layer. In this case, the adhesive bonding of the light emitting diode arrangement simultaneously ensures the mechanical fixing of the arrangement on the heat sink and also a thermal coupling of the arrangement to the heat sink. Thus, the heat emitted by the high power light emitting diodes is for example dissipated firstly to the thermally conductive layer. From there the heat is emitted to the flexible layer over a large area. The heat is then emitted to the heat sink through the thin adhesive-containing layer.

Owing to its particularly good thermal conductivity, the heat sink preferably contains a metal. In one embodiment of the illumination device, the heat sink is part of a lamp housing. In one particularly preferred embodiment, the luminiare housing is a housing for an automobile interior illumination, an automobile rear illumination, a brake light, a flashing indicator, or the like. The light emitting diode arrangement is adapted to the form of the respective lamp housing on account of the flexible circuit board.

Furthermore, another aspect of the present invention is directed to a method for producing a light emitting diode arrangement is specified. In this case, firstly an adhesive-containing layer is applied to the flexible circuit board. Afterward, the light emitting diodes are soldered onto that side of the circuit board which is remote from the adhesive-containing layer. In this case, the application of the adhesive-containing layer may be effected before the soldering operation, since a particularly heat-resistant adhesive is used. This order of the production process also proves to be particularly advantageous since the adhesive-containing layer can be applied particularly simply to the flexible circuit board without light emitting diodes mounted beforehand.

BRIEF DESCRIPTION OF THE DRAWINGS

FIG. 1 shows a schematic illustration of the surface of the flexible circuit board of the light emitting diode arrangement.

FIG. 2 shows a schematic illustration of the plane of the thermally conductive layer and the electrical conductor tracks.

BRIEF DESCRIPTION OF THE DRAWINGS

Figure 3:
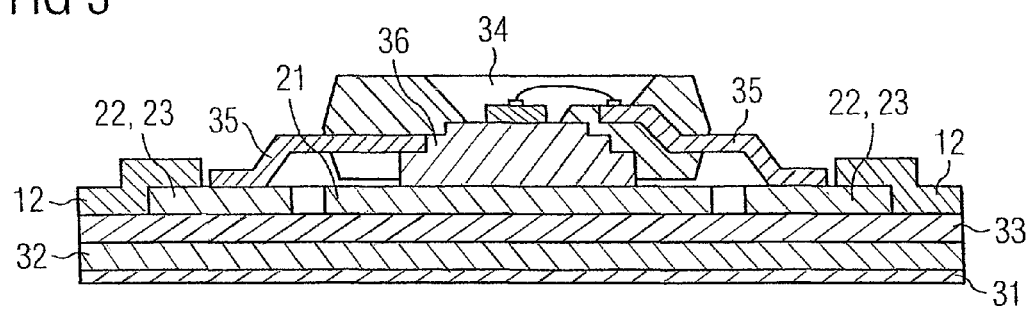
FIG. 3 shows a sectional view along line A-A' in FIG. 2 through a single section of the multi-section light emitting diode arrangement.

FIG. 1 shows the surface of the flexible circuit board 10 of the light emitting diode arrangement subdivided into six sections 11. In this case, FIG. 1 shows the top side of the circuit board 10, to which the light emitting diodes 34 can be applied. The surface of the flexible circuit board 10 is covered with an insulating layer 12. Situated in the insulating layer 12 are cutouts through which a connection to the electrical connection locations 13, the thermal contact area 14 and the electrical contact areas 15 is possible.

The exemplary embodiment of a light emitting diode arrangement having six sections 11 is not restrictive in this case. Rather it is possible to produce light emitting diode arrangements 10 having any desired number of sections 11.

The flexible circuit board 11 has an insulating layer 12 at its surface. The insulating layer 12 is provided by a layer containing soldering resist.

The electrical connection locations 13 are situated below cutouts in the insulating layer 12. At the electrical connection locations 13, a high power light emitting diode is electrically contact-connected and mechanically fixed to the flexible circuit board. In this case, electrical contact-connection and mechanical fixing of the high power light emitting diode preferably take place by means of a soldering connection.

The thermal contact area 14 is situated below a cutout in the insulating layer 12. At the thermal contact area 14, the high power light emitting diode is thermally coupled to the thermally conductive layer. The thermal connection part of the high power light emitting diode and the thermally conductive layer are preferably contact-connected at the thermal contact area 14 by means of a soldering connection. Besides a thermal contact-connection, this solder connection provides a mechanical fixing of the high power light emitting diode to the flexible circuit board However, a thermally conductive temperature-stable adhesive may also be used as an alternative to the soldering connection.

Electrical contact is made with the high power light emitting diode via the electrical contact areas 15. In this case, contact can be made with the totality of all the light emitting diodes of the light emitting diode arrangement by connecting the two outermost electrical contact areas 15a and 15b to a current source.

FIG. 2 shows the plane of the circuit board 10 with the thermally conductive layer 21 and the electrical conductor tracks 22, 23 of the flexible circuit board 10.

The high power light emitting diode is coupled to the thermally conductive layer 21 via the thermal contact area 14. In this case, the thermally conductive layer 21 has a particularly large area in order that the heat emitted by the high power light emitting diode can be emitted to the surroundings over a large area. In this case, the thermally conductive layer 21 is not in electrical contact with electrical conductor tracks 22, contact areas 15 or connection locations 13.

By way of example, the thermally conductive layer 21 may have an essentially round form. By way of example, the thermally conductive layer 21 occupies at least 60 percent of the area of the plane of the circuit board 10 in which it is situated. It preferably occupies at least 70 percent, particularly preferably at least 80 percent.

The electrical contact areas 15 and the electrical connection locations 13 are connected to one another by first electrical conductor tracks 22. The electrical connection locations 13 are interconnected by second electrical conductor tracks 23. In this case, the thermally conductive layer 21 and the electrical conductor tracks 22 and 23 may contain the same metal. Copper is preferably used in this case owing to its good electrical and thermal conductivity.

The construction of the light emitting diode arrangement shown makes it possible in this case to sever the light emitting diode arrangement along the line C-C', for example without restricting the contact-connection possibilities. Two circuit boards 10 each comprising three high power light emitting diodes arise as a result in this example.

Said high power light emitting diodes in turn can be electrically connected by means of the two outermost contact areas being contact-connected to a current source. It is possible, of course, to sever the light emitting diode also between the other sections 11 of the light emitting diode arrangement. It is possible in this case to separate the light emitting diode arrangement to an extent such that light emitting diode arrangements arise which in each case then have only one section 11 with a single high power light emitting diode.

FIG. 3 shows a sectional view through a single section 11 of the light emitting diode arrangement along the sectional line A-A'. In this case, the light emitting diode arrangement comprises a flexible circuit board, onto which is mounted a high power light emitting diode 34 with its electrical connection parts 35 and its thermal connection part 36. In this exemplary embodiment, the flexible circuit board comprises the following layers: a protective film 31, an adhesive-containing layer 32, a carrier layer 33, the thermally conductive layer 21 and the electrical conductor tracks 22, 23, and also an insulating layer 12.

The protective film 31, which contains a plastic, is situated at the underside of the light emitting diode arrangement 10. The protective film covers the adhesive-containing layer 32. In this case, the protective film 31 protects the adhesive-containing layer 32 against contamination, on the one hand, and on the other hand it prevents inadvertent adhesive bonding of the light emitting diode arrangement. In this case, the protective film 31 is configured in such a way that it can be stripped away easily in one work step from the adhesive-containing layer 32.

In the present exemplary embodiment, the adhesive-containing layer 32 is provided by a double sided adhesive tape. Said adhesive tape is chosen to be highly heat-resistant, on the one hand, so that it can withstand temperatures of up to 250° C. without being damaged. On the other hand, a very thin adhesive tape is chosen. In the present exemplary embodiment, the adhesive-containing layer 32 has a thickness of just 50 μm. This ensures that the heat emitted by the high power light emitting diode 34 can be emitted to the surroundings particularly rapidly through the adhesive-containing layer.

The adhesive-containing layer 32 is fixed at the flexible carrier layer 33. In this case, the carrier layer 33 preferably contains one of the following materials: polyimide, polyethylene naphthalate, polyester or FR4. It is conceivable in this case for other plastics also to be taken into consideration for use in the carrier layer 33. What is important in this case is that flexibility of the light emitting diode arrangement is preserved and the carrier layer 33 dissipates well the heat arising during operation of the high power light emitting diode.

The thermally conductive layer 21 and the electrical conductor tracks 22, 23 are applied to the carrier layer 33. They are followed by the insulating layer 12.

The high power light emitting diode 34 is applied by its electrical connection parts 35 at the electrical connection locations 13 and is thus connected to electrical conductor tracks 22, 23. In this case, the thermal connection part 36 of the high power light emitting diode 34 bears on the thermal contact area 14 and is soldered onto the thermally conductive layer 21 at said contact area.

The invention is not restricted by the description on the basis of the exemplary embodiments. Rather, the invention encompasses any new feature and also any combination of features which in particular comprises any combination of features in the patent claims, even if this feature or this combination itself is not explicitly specified in the patent claims or exemplary embodiments.

The invention claimed is:

1. A light emitting diode arrangement, comprising:
   a flexible circuit board comprising electrical conductor tracks and a thermally conductive layer;
   a plurality of sections, wherein each section has a single high power light-emitting diode, an associated pair of electrical contact areas, an associated pair of electrical connection locations, a plurality of first electrical conductor tracks, and a plurality of second electrical conductor tracks;
   a plurality of thermally conductive layers separated from each other; and a plurality of high power light-emitting diodes,
wherein the electrical contact areas and the electrical connection locations of a same section are electrically connected to one another by the first electrical conductor tracks, and
wherein the electrical connection locations of neighboring sections are electrically connected to one another by the second electrical conductor tracks; and
wherein each high power light emitting diode is mounted onto said flexible circuit board and in thermal contact with the thermally conductive layer, the high power light emitting diode including a thermal connection part in thermal contact with the thermally conductive layer;
wherein the thermally conductive layer and the electrical conductor tracks are positioned in a same plane of the flexible circuit board; and
wherein the thermally conductive layer occupies at least 60% of an area of said same plane.

2. The light emitting diode arrangement as claimed in claim 1, wherein the high power light emitting diode has a power consumption of at least 300 mW.

3. The light emitting diode arrangement as claimed in claim 1, wherein the high power light emitting diode is soldered onto the flexible circuit board.

4. The light emitting diode arrangement as claimed in claim 3, wherein the flexible circuit board contains at least one flexible carrier layer.

5. The light emitting diode arrangement as claimed in claim 4, wherein the flexible carrier layer contains at least one of the following materials: polyimide, polyethylene naphthalate, polyester, FR4.

6. The light emitting diode arrangement as claimed in claim 1, wherein the thermally conductive layer contains a metal.

7. The light emitting diode arrangement as claimed in claim 1, wherein the thermally conductive layer contains copper.

8. The light emitting diode arrangement as claimed in claim 1, wherein the at least one high power light emitting diode is soldered onto the thermally conductive layer.

9. The light emitting diode arrangement as claimed in claim 1, wherein the thermally conductive layer and the electrical conductor tracks contain the same metal.

10. The light emitting diode arrangement as claimed in claim 1, wherein an insulating layer is applied to a surface of the flexible circuit board.

11. The light emitting diode arrangement as claimed in claim 10, wherein the insulating layer includes cutouts for making electrical and thermal contact with the high power light emitting diode.

12. The light emitting diode arrangement as claimed in claim 10, wherein the insulating layer contains a soldering resist.

13. The light emitting diode arrangement as claimed in claim 1, wherein that side of the flexible circuit board which is remote from the at least one high power light emitting diode includes an adhesive-containing layer.

14. The light emitting diode arrangement as claimed in claim 13, wherein the adhesive-containing layer is formed by a double sided adhesive tape.

15. The light emitting diode arrangement as claimed in claim 13, wherein the adhesive-containing layer is heat-resistant up to temperatures of 250° C.

16. The light emitting diode arrangement as claimed in claim 13, wherein the adhesive-containing layer has a thickness of at most 60 μm.

17. The light emitting diode arrangement as claimed in claim 13, wherein the adhesive-containing layer is covered with a protective film.

18. The light emitting diode arrangement as claimed in claim 17, wherein the protective film contains a plastic.

19. The light emitting diode arrangement as claimed in claim 1, further comprising:
a multiplicity of high power light emitting diodes which are connected in series.

20. The light emitting diode arrangement as claimed in claim 19, further comprising:
a pair of contact areas for each high power light emitting diode of the multiplicity of high power light emitting diodes.

21. The light emitting diode arrangement as claimed in claim 20, further comprising:
sections, each section having a high power light emitting diode and the associated pair of contact areas.

22. The light emitting diode arrangement as claimed in claim 21, wherein the sections are arranged as repeating structures.

23. The light emitting diode arrangement as claimed in claim 22, wherein the sections are arranged in a series.

24. The light emitting diode arrangement as claimed in claim 1, further comprising:
at least one additional thermally conductive layer separated from the thermally conductive layer;
wherein each of the thermally conductive layer and the additional thermally conductive layer is connected to a respective single light-emitting diode.

25. An illumination device, having a light emitting diode arrangement as claimed in claim 1, and a heat sink on which the light emitting diode arrangement is applied.

26. The illumination device as claimed in claim 25, in which the light emitting diode arrangement is adhesively bonded onto the heat sink.

27. The illumination device as claimed in claim 25, in which the heat sink contains a metal.

28. The illumination device as claimed in claim 25, in which the lamp housing is the housing for one of the following lamps: automobile interior illumination, automobile rear illumination, brake light, flashing indicator.

29. The illumination device as claimed in claim 28, in which the heat sink is part of a lamp housing.

30. A light emitting diode arrangement, comprising:
a flexible circuit board comprising electrical conductor tracks and a thermally conductive layer; and
at least one high power light emitting diode mounted onto said flexible circuit board and in thermal contact with the thermally conductive layer;
wherein the thermally conductive layer and the electrical conductor tracks are positioned in a same plane of the flexible circuit board;
wherein the thermally conductive layer occupies at least 60% of an area of said same plane; and
wherein the thermally conductive layer is free of a region which forms a stripe or a rectangle.

31. The light emitting diode arrangement as claimed in claim 30, wherein the thermally conductive layer has an essentially round form.

32. The light emitting diode arrangement as claimed in claim 30, wherein the thermally conductive layer includes at least one recess or concave region which partially surrounds at least one of the electrical conductor tracks.

33. A light emitting diode arrangement, comprising:
a flexible circuit board comprising electrical conductor tracks and a thermally conductive layer;

a plurality of sections, wherein each section has a single high power light-emitting diode, an associated pair of electrical contact areas, an associated pair of electrical connection locations, a plurality of first electrical conductor tracks, and a plurality of second electrical conductor tracks;

a plurality of thermally conductive layers separated from each other; and a plurality of high power light-emitting diodes, wherein the electrical contact areas and the electrical connection locations of a same section are electrically connected to one another by the first electrical conductor tracks, and wherein the electrical connection locations of neighboring sections are electrically connected to one another by the second electrical conductor tracks; and wherein each high power light emitting diode is mounted onto said flexible circuit board and in thermal contact with the thermally conductive layer, the at least one high power light emitting diode including a thermal connection part in thermal contact with the thermally conductive layer, and the thermal contact being producible by soldering the thermal connection part of the high power light emitting diode onto the thermally conductive layer;

wherein the thermally conductive layer and the electrical conductor tracks are positioned in a same plane of the flexible circuit board; and wherein the thermally conductive layer occupies at least 60% of an area of said same plane.

34. A light emitting diode arrangement, comprising:

a flexible circuit board comprising electrical conductor tracks and a plurality of thermally conductive layers, the plurality of thermally conductive layers and the electrical conductor tracks being positioned in a same plane of the flexible circuit board;

wherein the light emitting diode arrangement is divided into sections, said sections each including a high power light emitting diode mounted onto an associated flexible circuit board, an associated pair of electrical contact areas and a thermally conductive layer;

wherein the associated pair of contact areas are provided for the high power light emitting diode;

wherein the thermally conductive layers of each different section of the sections are spatially separated from each other;

wherein the light emitting diode arrangement is separable along lines between each of the plurality of thermally conductive layers to create individual sections which each include the high power light emitting diode, the associated pair of electrical contact areas and the thermally conductive layer;

wherein the high power light emitting diode is in thermal contact with the thermally conductive layer; and wherein the thermally conductive layer occupies at least 60% of an area of the associated flexible circuit board.

* * * * *

UNITED STATES PATENT AND TRADEMARK OFFICE
CERTIFICATE OF CORRECTION

PATENT NO. : 8,975,532 B2
APPLICATION NO. : 10/590744
DATED : March 10, 2015
INVENTOR(S) : Marco Friedrich et al.

Page 1 of 1

It is certified that error appears in the above-identified patent and that said Letters Patent is hereby corrected as shown below:

Title page, Item (73), change "OSPAM" to --OSRAM--.

In the Claims

In claim 29, line 1, change "28" to --25--.

Signed and Sealed this
Twenty-eighth Day of July, 2015

Michelle K. Lee
*Director of the United States Patent and Trademark Office*